US008503259B2

United States Patent
Shibazaki et al.

(10) Patent No.: US 8,503,259 B2
(45) Date of Patent: Aug. 6, 2013

(54) MEMORY TEST METHOD AND MEMORY TEST DEVICE

(75) Inventors: Shogo Shibazaki, Kawasaki (JP); Shinkichi Gama, Kawasaki (JP); Hideyuki Negi, Kawasaki (JP); Takeshi Nagase, Kawasaki (JP); Chikahiro Deguchi, Kawasaki (JP); Yutaka Sekino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 324 days.

(21) Appl. No.: 12/382,485

(22) Filed: Mar. 17, 2009

(65) Prior Publication Data

US 2009/0296505 A1 Dec. 3, 2009

(30) Foreign Application Priority Data

May 30, 2008 (JP) ................................. 2008-143893

(51) Int. Cl.
*G11C 29/00* (2006.01)
(52) U.S. Cl.
USPC ............ 365/201; 365/200; 714/718; 714/719
(58) Field of Classification Search
USPC ........ 365/201, 189.05, 230.06, 200; 714/719, 714/718
See application file for complete search history.

(56) References Cited

U.S. PATENT DOCUMENTS

| 6,317,851 B1 * | 11/2001 | Kobayashi | 714/720 |
| 6,345,372 B1 | 2/2002 | Dieckmann et al. | |
| 2005/0185495 A1 * | 8/2005 | Lee et al. | 365/230.06 |
| 2008/0005631 A1 * | 1/2008 | Kim et al. | 714/719 |

FOREIGN PATENT DOCUMENTS

| JP | 06-242190 | 9/1994 |
| JP | 10-161940 | 6/1998 |
| JP | 2000-285700 | 10/2000 |
| JP | 2003-521011 | 7/2003 |

OTHER PUBLICATIONS

Japanese Office Action issued Sep. 25, 2012 in corresponding Japanese Patent Application No. 2008-143893.

* cited by examiner

*Primary Examiner* — Pho M Luu
*Assistant Examiner* — Thao Bui
(74) *Attorney, Agent, or Firm* — Staas & Halsey LLP

(57) ABSTRACT

A memory test is performed by sequentially generating a number of n-bit addresses, whose first to k-th bits ($1 \leq k \leq n$) are all set to one of two values, 0 or 1, and whose (k+1)th to n-th bits are all set to the other one of the two values, for all k's which range from 1 to n; writing first test data to each of the generated addresses in the memory; reading second test data from each of the addresses in the memory; and comparing the first test data with the second test data.

7 Claims, 7 Drawing Sheets

MEMORY TEST METHOD AND MEMORY TEST DEVICE

CROSS-REFERENCE TO RELATED APPLICATION

This application is based upon and claims the benefit of priority of the prior Japanese Application No. 2008-143893, filed on May 30, 2008, the entire contents of which are incorporated herein by reference.

FIELD

The present invention relates to a method and device for testing a memory.

BACKGROUND

BIST (Built-In Self-Test) is performed to test and verifie the proper operation of memory devices, such as SRAM (Static Random Access Memory), DRAM (Dynamic Random Access Memory), and Pseudo SRAM (Pseudo Static Random Access Memory) by using a BIST module (refer to Japanese Unexamined Patent Publication No. 6-242190 and Japanese Patent No. 3867146). The BIST module is incorporated in a memory controller implemented in the form of LSI (Large Scale Integration) circuits.

When testing a memory by BIST, data write/read operations are performed to all the addresses in the memory space. Accordingly, if the number of address bits is 20, for example, in other words, if the number of address lines is 20, at least $2^{20}$ data write/read operations will have to be performed.

It is also practiced to test not only a memory but also the address lines or the BIST itself by connecting a test circuit in place of the memory. However, if the test is to be performed throughout the entire memory space, it will take an enormous amount of time to complete the testing of the BIST itself. Accordingly, when performing the test to verify the operation of the BIST, the test has been performed only to the lower address bits by employing a simplified test mode. However, since the test is not performed by driving the higher address bits, it has not been possible to check the higher address lines for faults such as shorts and opens. Furthermore, it has not been possible to use the simplified test mode for actually testing the memory.

SUMMARY

According to an aspect of the invention, there is provided a memory test method for testing a memory by generating an n-bit address (where n is a positive integer) and by writing and reading test data to and from the memory by using the address, the method comprising: sequentially generating a number (n+1) of addresses, whose first to k-th bits ($1 \leq k \leq n$) are all set to one of two values, 0 or 1, and whose (k+1)th to n-th bits are all set to the other one of the two values, for all k's which range from 1 to n; writing first test data to each of the (n+1) generated addresses in the memory; reading second test data from each of the (n+1) addresses in the memory; comparing the first test data with the second test data; and determining that the memory is faulty, if the first test data and the second test data do not match each other as a result of the comparison.

According to an aspect of the invention, there is provided a memory test device for testing a memory by generating an n-bit address (where n is a positive integer) and by writing and reading test data to and from the memory by using the address, the device comprising: an address generator for sequentially generating a number (n+1) of addresses, whose first to k-th bits ($1 \leq k \leq n$) are all set to one of two values, 0 or 1, and whose (k+1)th to n-th bits are all set to the other one of the two values, for all k's which range from 1 to n; a test data generator for generating first test data, and for writing the generated test data to each of the (n+1) generated addresses in the memory; a data comparator for reading second test data from each of the (n+1) addresses in the memory, and for comparing the first test data with the second test data; and a test evaluator for determining that the memory is faulty, if the first test data and the second test data do not match each other as a result of the comparison.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be described below with reference to the drawings.

Figure 1:
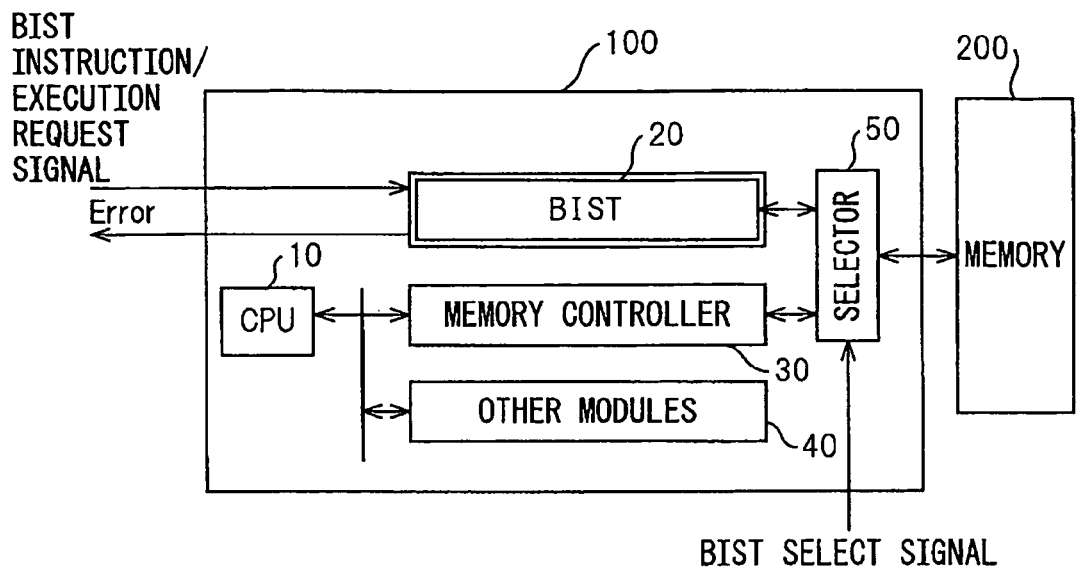
FIG. 1 is diagram illustrating a memory and an LSI to which one embodiment is applied.
Figure 2:
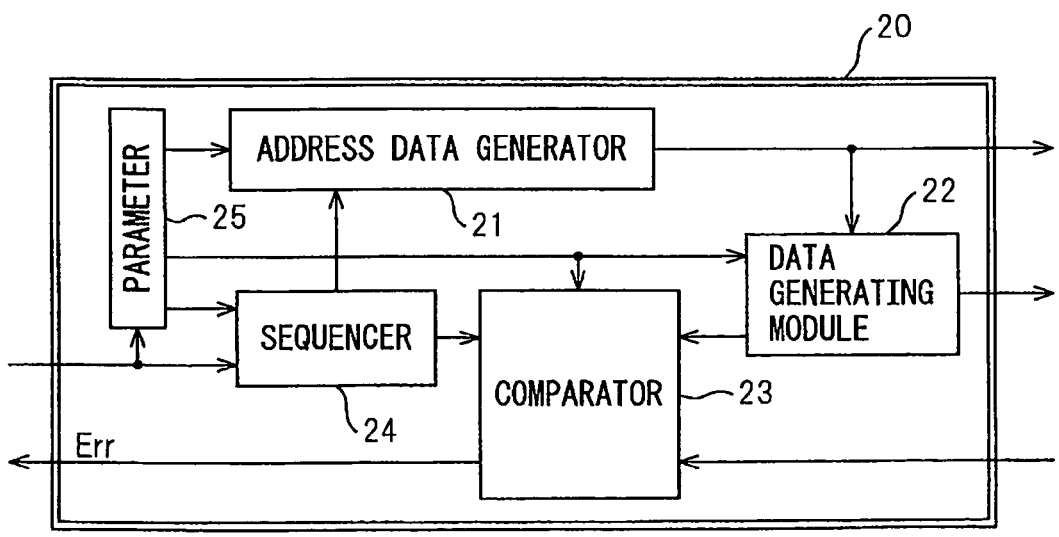
FIG. 2 is a diagram illustrating a BIST module incorporated in the LSI.

FIG. 1 is a diagram illustrating one example of an LSI having a BIST module to which one embodiment is applied, and FIG. 2 is a diagram illustrating one example of the internal configuration of the BIST module.

As illustrated in FIG. 1, in the LSI 100, a CPU (Central Processing Unit) 10 is connected to a memory controller 30 and other modules 40 via a bus 20. The LSI 100 further includes a BIST module 20 for memory test. The memory controller 30 and the BIST module 20 are selected by a selector 50 to be connected to a memory 200. In memory operation, the memory controller 30 is connected to the memory 200 to control the memory 200.

When a BIST select signal and a BIST instruction/execution request signal are input to the selector 50, the BIST module 20 executes a predetermined memory test.

As illustrated in FIG. 2, in the BIST module 20, the BIST operation instruction signal is input to a parameter output unit 25 and a sequencer 24. The parameter output unit 25 outputs a parameter for specifying a normal test mode or a simplified test mode, which is supplied to an address data generator 21. A sequence for generating address data in accordance with the normal test mode or the simplified test mode is supplied to the address data generator from the sequencer 24. The address data generated by the address data generator are supplied in parallel to the memory by using lines corresponding to the respective bits of the address. For example, when the address is a 20-bit address, 20 address lines are used.

The address data generator 21 generates an address for accessing the memory 200 in accordance with the signals supplied from the parameter output unit 25 and the sequencer 24. Data generated by a data generating module 22 is written to the address specified by the address data generator 21. After the data is written to the address, the written data is read out of the memory 200 and input to a comparator 23 where the readout data is compared with the write data to verify whether they match or not. If they do not match, error processing is performed by determining that an error is occurred.

The present embodiment is described as a test that includes the address specification sequence generated by the sequencer 24. Alternatively, data for specifying the address may be generated by software external to the BIST module 20 and loaded into the BIST module 20 to generate the address data by controlling the address data generator.

Figure 3:
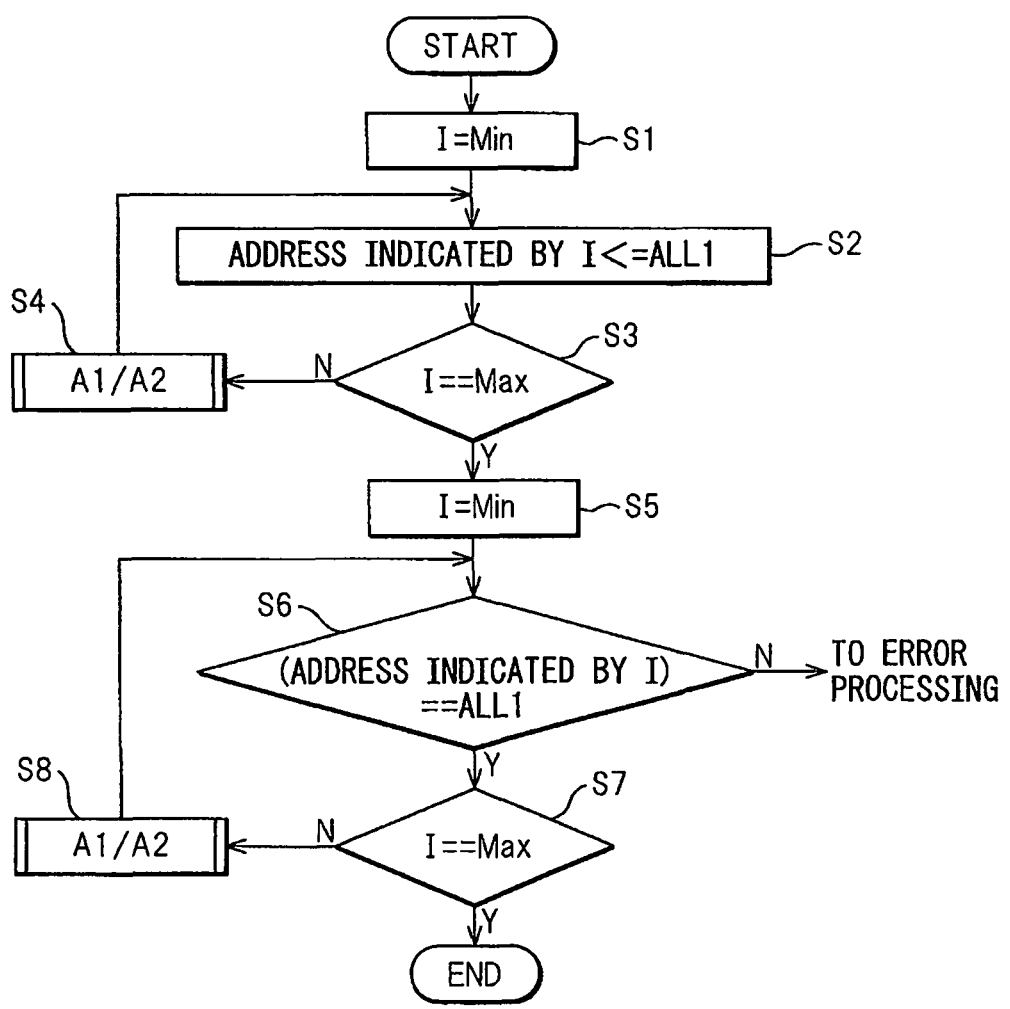
FIG. 3 is a diagram illustrating an operation flow of one embodiment in which the address is specified by counting up starting from a minimum value.

FIG. 3 is an operation flow for the memory test according to the present embodiment. In the memory test, data is sequentially written to the specified addresses, and when the writing is completed, the data is sequentially read out of the specified addresses and compared with the write data. In the following description, binary states or two states are represented by a 0 and a 1, but which state, 0 or 1, is made to correspond to which of the two physical states can be determined arbitrarily.

First, the address I is set to specify the minimum value 0 (step S1). Next, data of all 1s is written to the specified address I (step S2). In the illustrated example, it is assumed that data of all 1s is written to simplify the explanation, but data consisting of a suitable combination of 1s and 0s may be selected for writing. In step S3, it is determined whether the address I has reached the maximum value. If the address I has not yet reached the maximum value, the process proceeds to step S4.

Figure 4:
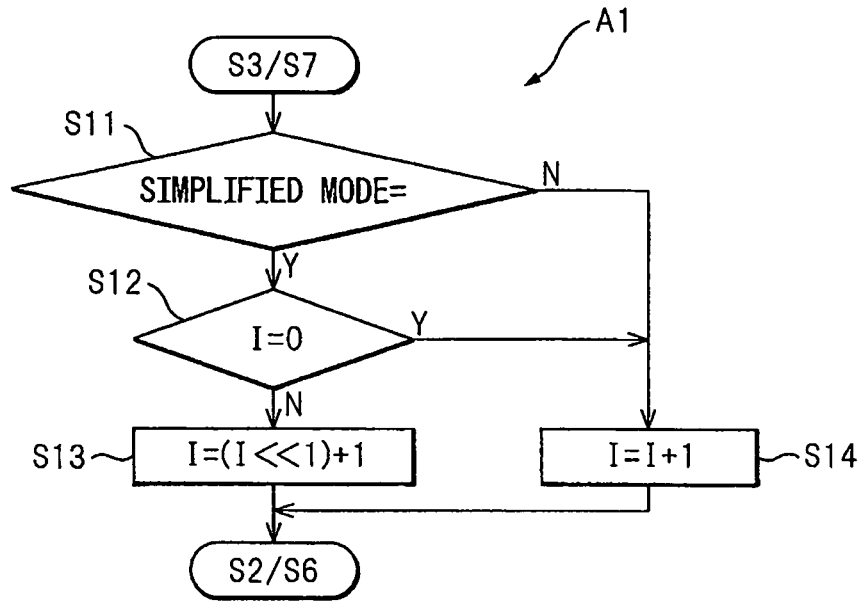
FIG. 4 is a diagram illustrating one example of the address specification in the operation flow of FIG. 3.

FIG. 4 is a diagram illustrating a process A1 as one example of the operation flow performed in step S4 of FIG. 3. In the process A1, address specification is performed.

When the process proceeds from step S3 in FIG. 3 to step S11, it is determined in step S1 whether the test mode is the simplified test mode or not. If it is not the simplified test mode, the test mode is the normal full test mode, so that the process proceeds to step S14 to increment the address, and then returns to step S2 in FIG. 3. In the full test mode, all the addresses are sequentially specified, and data of all 1s is written to each specified address.

If it is determined in step S11 that the test mode is the simplified test mode, the process proceeds to step S12 to determine whether the address I is the minimum value 0. If the address I is the minimum value 0, the address I is incremented to 1 in step S14, and the process returns to step S2 in FIG. 3. If it is determined in step S12 that the address I is not the minimum value 0, that is, the address I is 1 or larger, the process proceeds to step S13 where the address is shifted upward by one bit (I<<1) and 1 is added to the address. The resulting address is taken as the address I. Then, the process returns to step S2 in FIG. 3. In step S2, data of all 1s is written to each specified address I. In this way, the address is specified by setting to 1 every lower bit than the bit that has been changed to 1.

When the address I, for example, is an 8-bit address, the address I is specified in the process A1 as indicated in the following example 1. The numbers in parentheses are decimal numbers shown for reference.

EXAMPLE 1

| | |
|---|---|
| 00000000 | (0) |
| 00000001 | (1) |
| 00000011 | (3) |
| 00000111 | (7) |
| 00001111 | (15) |
| 00011111 | (31) |
| 00111111 | (63) |
| 01111111 | (127) |
| 11111111 | (255) |

The data is sequentially written to the specified addresses by repeating the loop of steps S2 to S4 in FIG. 3, and if it is determined in step S3 that the address I has reached the maximum value (255), the process proceeds to step S5 to initiate the read process.

In step S5, the address I is set to specify the minimum value "0". In step S6, the data is read out of the specified address I. The readout data is checked if it consists of all 1s. If the readout data does not consist of all 1s, it is determined that an error occurred, and error processing is performed.

If the readout data in step S6 consists of all 1s, the process proceeds to step S7 to determine whether the address I has reached the maximum value. If it is determined that the address I has not yet reached the maximum value, the process proceeds to step S8.

In step S8, the same process as the process A1 of FIG. 4 is performed. That is, the same addresses as the write addresses are sequentially specified, and the process returns to step S6. Each time the loop of steps S6 to S8 is performed, the data is read out of the address to which the data has been written, and the readout data is checked if it consists of all 1s. If it is determined in step S7 that the address I has reached the maximum value, the test is terminated.

In the present embodiment, first, as can be seen from the address 00000001 in example 1, only the least significant bit line is tested to determine whether it is functioning properly. Since the address thereafter changes to 00000011, 00000111, and so on, all the address lines can be checked for proper functioning. For example, when the address is an 8-bit address, 256 write/read operations are performed in the normal mode, but in the simplified mode, the test is completed with 9 write/read operations, as indicated in example 1. Accordingly, the test time can be drastically reduced.

Figure 5:
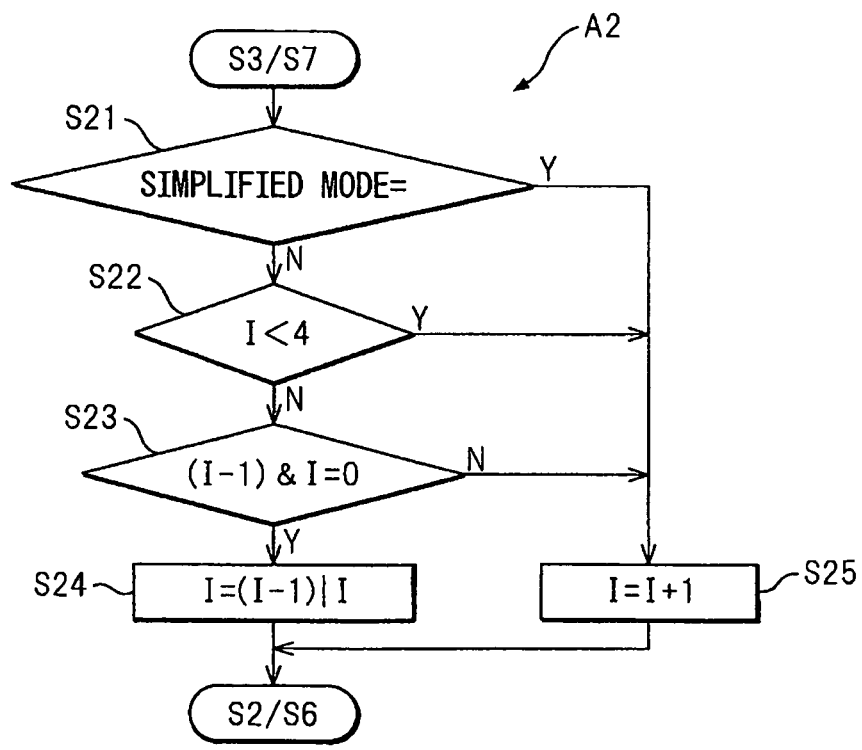
FIG. 5 is a diagram illustrating one example of the address specification in the operation flow of FIG. 3.

FIG. 5 is a diagram illustrating a process A2 as an alternative to the process A1 of FIG. 4. In the process A2, not only can the address lines be checked, but the counter incorporated in the address data generator in the BIST module can also be checked.

The process A2 is executed in step S4 of FIG. 3, that is, for the addressing in the write cycle, and also in step S8, that is, for the addressing in the read cycle. Accordingly, the data is written in accordance with the address specified in the process A2; then, the data is read out in accordance with the address specified in the process A2, and the readout data is compared with the write data for each address.

The following description deals only with the process A2.

In step S21 of FIG. 5, it is determined whether the test mode is the simplified test mode or not. If it is not the simplified test mode, the test mode is the full test mode, so that the process proceeds to step S25 to increment the address, and then returns to step S2 in FIG. 3.

If it is determined in step S21 that the test mode is the simplified test mode, then it is determined in step S22 whether the address I is smaller than 4. If the address I is smaller than 4, the process proceeds to step S25 to increment the address I by 1, and the resulting address is taken as the address I; then, the process returns to step S2 in FIG. 3. Since the address I is incremented in this way until it reaches 3, the address I changes from 00 to 01, to 10, and then to 11.

If it is determined in step S22 that the address I is 4 or larger, the process proceeds to step S23 where (I−1) is ANDed with 1 and the result is checked if it is equal to 0. If the result of (I−1) ANDed with 1 is equal to 0 in step S23, the process proceeds to step S24 where (I−1) is ORed with 1, and the result is taken as the address I; then, the process returns to step S2 in FIG. 3.

For example, when the address I is 4 which translates to 100, the address (4−1)=3 is 011. Accordingly, (I−1) ANDed with 1 yields 0. Since the new address is (I−1) ORed with 1 (step S24), the address is given as 100|100=111.

If the result of (I−1) ANDed with 1 is not equal to 0 in step S23, the process proceeds to step S25 where the address I is incremented, and the resulting address is taken as the new address I; then, the process returns to step S2 in FIG. 3.

For example, when the address I is 7 which translates to 111, since (I−1) is 6 which translates to 110, (I−1) ANDed with 1 does not yield 0. Accordingly, the address is incremented by 1 to 1000.

In the process A2, when the address I is an 8-bit address, for example, the address changes as indicated in the following example 2. The numbers in parentheses are decimal numbers shown for reference.

EXAMPLE 2

| | |
|---|---|
| 00000000 | (0) |
| 00000001 | (1) |
| 00000010 | (2) |
| 00000011 | (3) |
| 00000100 | (4) |
| 00000111 | (7) |
| 00001000 | (8) |
| 00001111 | (15) |
| 00010000 | (16) |
| 00011111 | (31) |
| 00100000 | (32) |
| 00111111 | (63) |
| 01000000 | (64) |
| 01111111 | (127) |
| 10000000 | (128) |
| 11111111 | (255) |

In the process A2 also, all the address lines are tested, and the test is completed with 16 write/read operations; accordingly, the test can be completed in a short time compared with the normal mode.

In example 2, since only each address line is specified such as 00010000, there is offered the additional effect that the functioning of each address line can be tested with higher precision.

Further, after the least significant bit of the address is set to 1, the address counts up, generating a carry; after that, the address changes in such a manner that every lower order bit than the bit to which the carry was made is set to 1.

For example, referring to example 2, first the least significant bit of the address is set to 1, as indicated in 00000001 (1). Then, the address counts up by adding 1, as shown in 00000010 (2), generating a carry. Next, the lower bit than the bit that has been changed to 1 because of the carry is set to 1, as indicated in 00000011 (3).

Next, the address counts up from 00000011 (3) to 00000100 (4), generating a carry, and then from 00000100 (4) to 00000111 (7) by setting every lower bit to 1. The addresses are sequentially specified with the carry operation alternating with the operation of setting every lower bit in the previous address to 1. In example 2, seven carry operations are performed.

Accordingly, when the address changing operation 30 that generates a carry, as in the process A2, is built into the test, as described above, the address counter incorporated in the address data generator, which operates in response to the carry operation, can also be tested.

Figure 6:
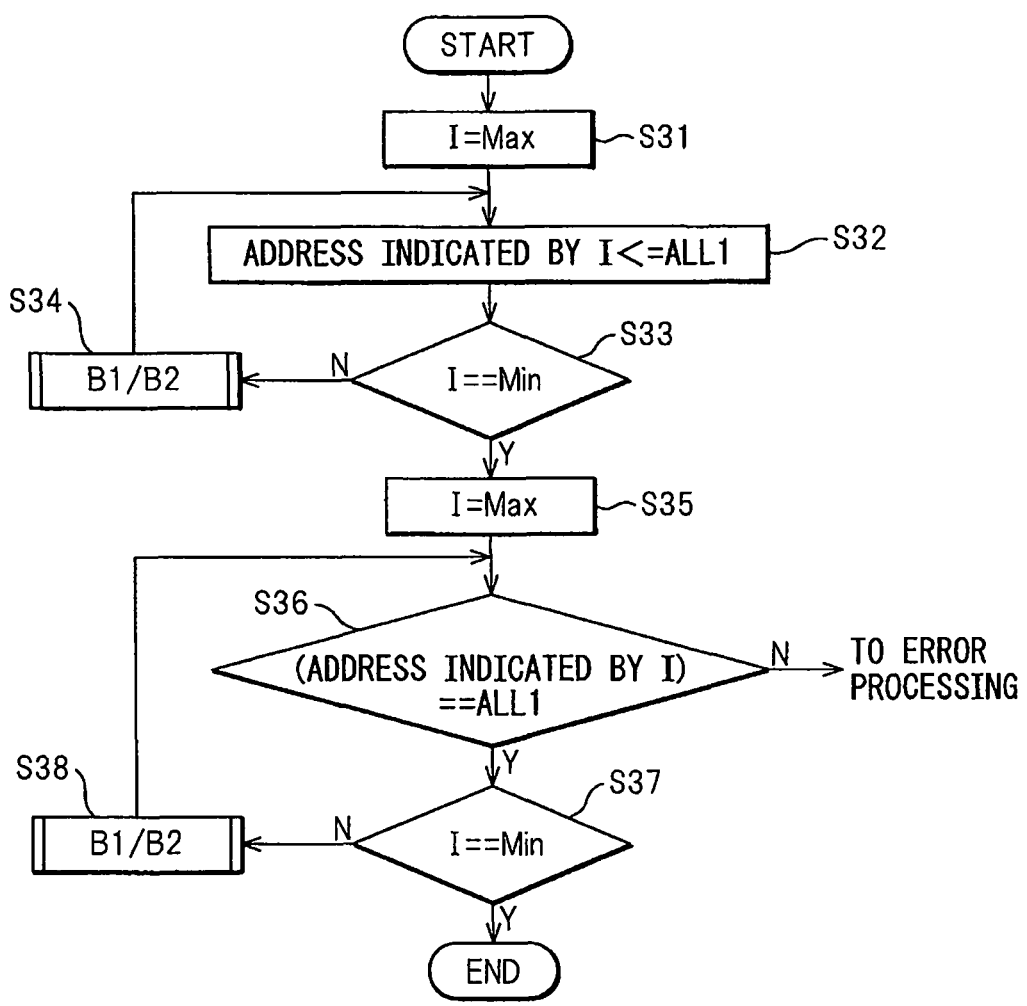
FIG. 6 is a diagram illustrating an operation flow of one embodiment in which the address is specified by counting down starting from a maximum value.

FIG. 6 is a memory test operation flow according to another embodiment.

In FIG. 3, the address was specified by counting up starting from the minimum value toward the maximum value, but in the embodiment illustrated in FIG. 6, the address counts down starting from the maximum value toward the minimum value.

First, the address is set to the maximum value (S31), and data of all 1s is written to the thus specified address (S32). Here, writing data of all 1s to each specified address is only illustrative and not restrictive, as earlier noted. Next, it is determined whether the address I has reached the minimum value (S33); if the address I has not yet reached the minimum value, the next address is specified in step S34. The address specification in step S34 will be described in detail later.

When the address is specified, the process returns to step S32. The loop of steps S32 to S34 is repeated until the data has been written to all the specified addresses and, when it is determined in step S33 that the address I has reached the minimum value, the process proceeds to step S35.

In step S35 and subsequent steps, the written data is read out. The address I is set to the maximum address (S35), the data is read out of the thus specified address I, and the readout data is checked if it consists of all 1s. If the readout data does not consist of all 1s, the process proceeds to perform error processing.

If the readout data consists of all 1s, the process proceeds to step S37 to determine whether the address I has reached the minimum value. If it is determined that the address I has not yet reached the minimum value, the process proceeds to step S38 where the same processing as that of step S34 is performed to specify the next address, and the process returns to step S36.

In this way, the loop of steps S36 to S38 is repeated, and when the address reaches the minimum value (S37), the test is terminated.

Figure 7:
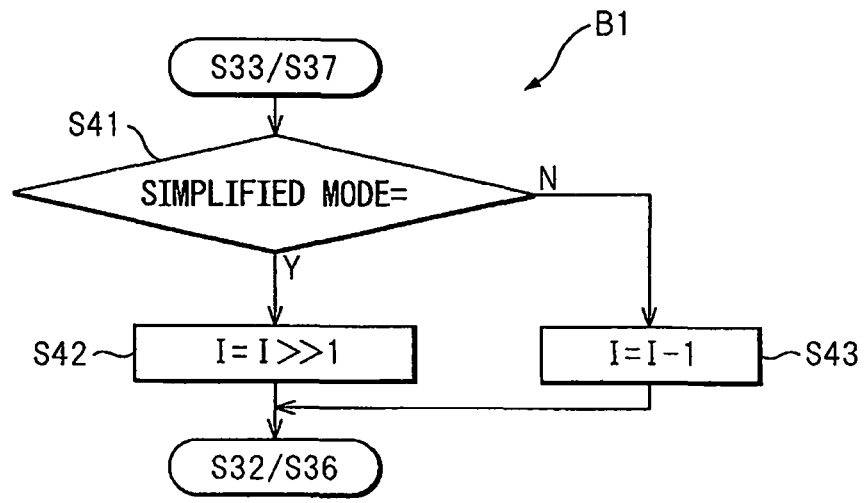
FIG. 7 is a diagram illustrating one example of the address specification in the operation flow of FIG. 6.

FIG. 7 is a diagram showing the flow of process B1 as one example of the processing performed in steps S34 and S38.

The process B1 comprises steps S41 to S43. In step S41, it is determined whether the test mode is the simplified mode or the normal mode. If it is not the simplified mode, the process proceeds to step S43 where the address I is decremented to specify the address (I−1), and the process returns to step S32. In this case, since the test mode is the normal mode, the test is performed on all the addresses.

If it is determined in step S41 that the test mode is the simplified mode, the process proceeds to step S42 where the address is shifted down by one bit, and the result is taken as the address.

For example, when the address I is an 8-bit address, the address changes in the process B1 in step S54 as shown in the following example 3. The numbers in parentheses are decimal numbers shown for reference.

EXAMPLE 3

| | |
|---|---|
| 11111111 | (255) |
| 01111111 | (127) |
| 00111111 | (63) |
| 00011111 | (31) |
| 00001111 | (15) |
| 00000111 | (7) |
| 00000011 | (3) |
| 00000001 | (1) |
| 00000000 | (0) |

In example 3, the sequence of the address specification is reversed from that shown in example 1. In the processes A1 and B1, a number (n+1) of n-bit addresses (where n is a positive integer), whose first to k-th bits (1≤k≤n) are all set to one of two values, 0 or 1, and whose (k+1)th to n-th bits are all set to the other one of the two values, are sequentially generated for all k's which range from 1 to n. In the process B1 also, as in the process A1, since all the address lines are driven, all the address lines can be tested. The test time can also be reduced drastically.

Figure 8:
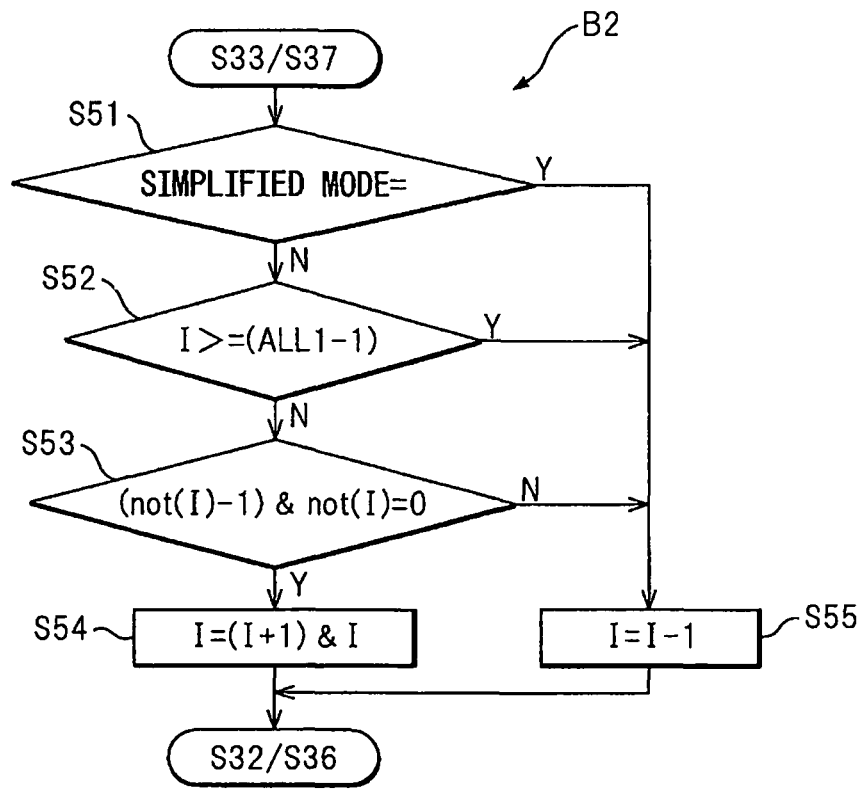
FIG. 8 is a diagram illustrating one example of the address specification in the operation flow of FIG. 6.

FIG. 8 is a diagram showing the flow of process B2 as another example of the processing performed in steps S34 and S38.

In step S51, it is determined whether the test mode is the simplified mode or the normal mode. If it is not the simplified mode, the process proceeds to step S55 where the address I is decremented to specify the address (I−1), and the process returns to step S32. In this case, since the test mode is the normal mode, the test is performed on all the addresses from the maximum to the minimum value.

If it is determined in step S51 that the test mode is the simplified mode, the process proceeds to step S52 where the address I is compared with (maximum value−1). If the address I is larger than (maximum value−1), that is, if the address I is equal to the maximum value, the process proceeds to step S55 where the address I is decremented to specify the address (I−1).

If the address I is not larger than (maximum value−1) in step S52, the process proceeds to step S53 where the result of subtracting 1 from the negation of the address I is ANDed with the negation of the address I to see if the AND yields zero. If the AND does not yield zero, the process proceeds to step S55 where the address is decremented. If the AND yields zero, the process proceeds to step S54 where the address (I+1) is ANDed with I, and the result is taken as the address I.

For example, when the address I is an 8-bit address, the address changes in the process B2 in step S34 as indicated in the following example 4.

EXAMPLE 4

| | |
|---|---|
| 11111111 | (255) |
| 11111110 | (254) |
| 11111101 | (253) |
| 11111100 | (252) |
| 11111011 | (251) |
| 11111000 | (248) |
| 11110111 | (247) |
| 11110000 | (240) |
| 11101111 | (239) |
| 11100000 | (224) |
| 11011111 | (223) |
| 11000000 | (192) |
| 10111111 | (191) |
| 10000000 | (128) |
| 01111111 | (127) |
| 00000000 | (0) |

For example, consider the case where the address I=11111100; here, since NOT(I)=00000011, it follows in step S53 that NOT(I)−1=00000010. ANDing (NOT(I)−1) with NOT(I) does not yield zero. Accordingly, the address I(=11111100) is decremented in step S55, and the new address I is given as 11111011.

When the address I=11111011, since NOT(I)=00000100, it follows in step S53 that NOT(I)−1=00000011. ANDing (NOT(I)−1) with NOT(I) yields zero. Accordingly, in step S54, (I+1=11111100) is ANDed with (I=11111011), and the result is taken as the new address.

As contrasted with the processes A1 and B1, the processes A2 and B2 generate addresses whose k-th bit is set to one of two values, 0 or 1, and whose first to (k−1)th bits and (k+1)th to n-th bits are all set to the other one of the two values.

In the above example also, all the address lines can be tested, and the number of write/read operations can be reduced, reducing the time required for testing. Furthermore, since there are included cases where only one address line is set to 0 while the others are all set to 1, the functioning of each address line can be tested with high precision, as in the process A2.

Further, after the least significant bit of the address is set to 0, the address counts down, generating a borrow; after that, the address changes in such a manner that every lower order bit than the bit that has been changed to 0 because of the borrow is set to 0.

For example, referring to example 4, first the least significant bit is set to 0, and the result 11111110 (254) is specified as the address. Then, 11111101 (253) obtained by generating a borrow by subtracting 1 is specified as the address. Next, the lower order bit than the bit that has been changed to 0 because of the borrow is set to 0, to specify the next address 11111100 (252).

Then, the next address 11111011 (251) is obtained by subtracting 1 from 11111100 (252), generating a borrow, and the next address 11111000 (248) is created by setting to 0 every lower significant bit than the bit that has been changed to 0 in 11111011 (251). Thereafter, the process proceeds by performing the borrow operation alternately with the operation of setting to 0 every lower order bit than the bit that has been changed to 0 because of the borrow.

When the address changing operation that generates a borrow, as in the process B2, is built into the test, as described above, the address counter incorporated in the address data generator, which operates in response to the borrow operation, can also be tested.

Figure 9:
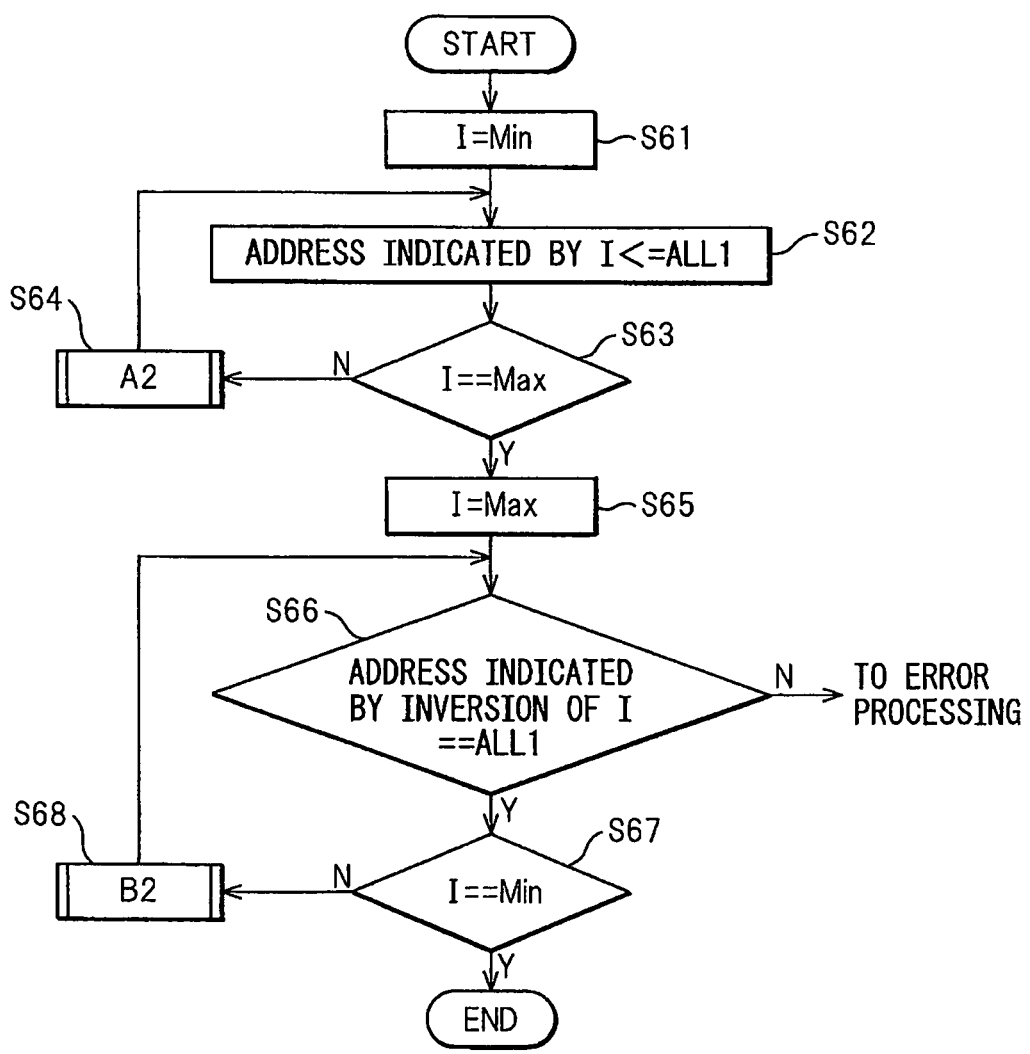
FIG. 9 is a diagram illustrating an operation flow of one embodiment in which address count-up is combined with address count-down.

FIG. 9 is a diagram showing one example of a memory test for the case where the address count differs between the write and read cycles. In the example shown in FIG. 9, the address counts up when writing and counts down when reading, but conversely, the address may be made to count down when writing and count up when reading.

In FIG. 9, steps S61 to S64 are for the write cycle, and steps S65 to S68 are for the read cycle. In the write cycle, the address is set to the minimum value (S61), and in the loop of steps S62 to S64, the address is specified in accordance with the process A2 of FIG. 5 (S64), and data of all 1s is written to the specified address (S62), the loop being repeated until the address counts up to the maximum value. When the address is an 8-bit address, the address changes in the same manner as shown in example 2.

In the read cycle (S65 to S68), the address of the maximum value is specified as the starting address (S65). Next, the specified address is inverted, and the data is read out of the thus obtained address and compared with the write data (S66). If the result of the comparison indicates a mismatch, error processing is performed.

If the result of the comparison in step S66 indicates a match, the process proceeds to step S67 to determine whether the address I has reached the minimum value. If the address I has not yet reached the minimum value, the process proceeds to step S68 where the process B2 of FIG. 8 is performed to specify the next address; then, the data is read out of the address indicated by the inversion of the specified address, and the readout data is compared with the write data (S62). As shown in the following example 5, when the address specified in the process B2 is inverted, the resulting address matches the address specified in the process A2, so that the data written to the address can be read out of the same address and compared with the write data. When the address I sequentially specified in the process B2 reaches the minimum value (S67), the process is terminated.

As described above, in FIG. 9, in the write cycle the data is written in accordance with the address specified in the process A2, and in the read cycle, the data is read out in accordance with the address obtained by inverting the address specified in the process B2.

When the address I is an 8-bit address, the address changes in the process B2 as previously shown in example 4. The addresses obtained by inverting the addresses of example 4 are as indicated in the following example 5.

EXAMPLE 5

00000000
00000001
00000010
00000011
00000100
00000111
00001000
00001111
00010000
00011111
00100000
00111111
01000000
01111111
10000000
11111111

The addresses specified in example 5 are the same as those shown in example 2 in the process A2. Accordingly, the data written to the addresses specified in the process A2 can be read out of the same addresses by inverting the addresses specified in the process B2.

In FIG. 9, the process B2 may be performed in step S64 and the process A2 in step 68, and the address may be made to count down when writing and count up when reading.

In the normal mode, when writing, the address is incremented starting from the minimum value, and the data is written to all the addresses, but when reading, the addresses are sequentially specified by decrementing the address starting from the maximum value; here, by inverting the addresses, the data can be read out starting from the address of the minimum value.

The above embodiment not only has the same effect as the embodiment that uses the process A2 or the process B2, but also offers the advantage that the counter up/down operations in the address data generator can be tested at the same time.

Figure 10:
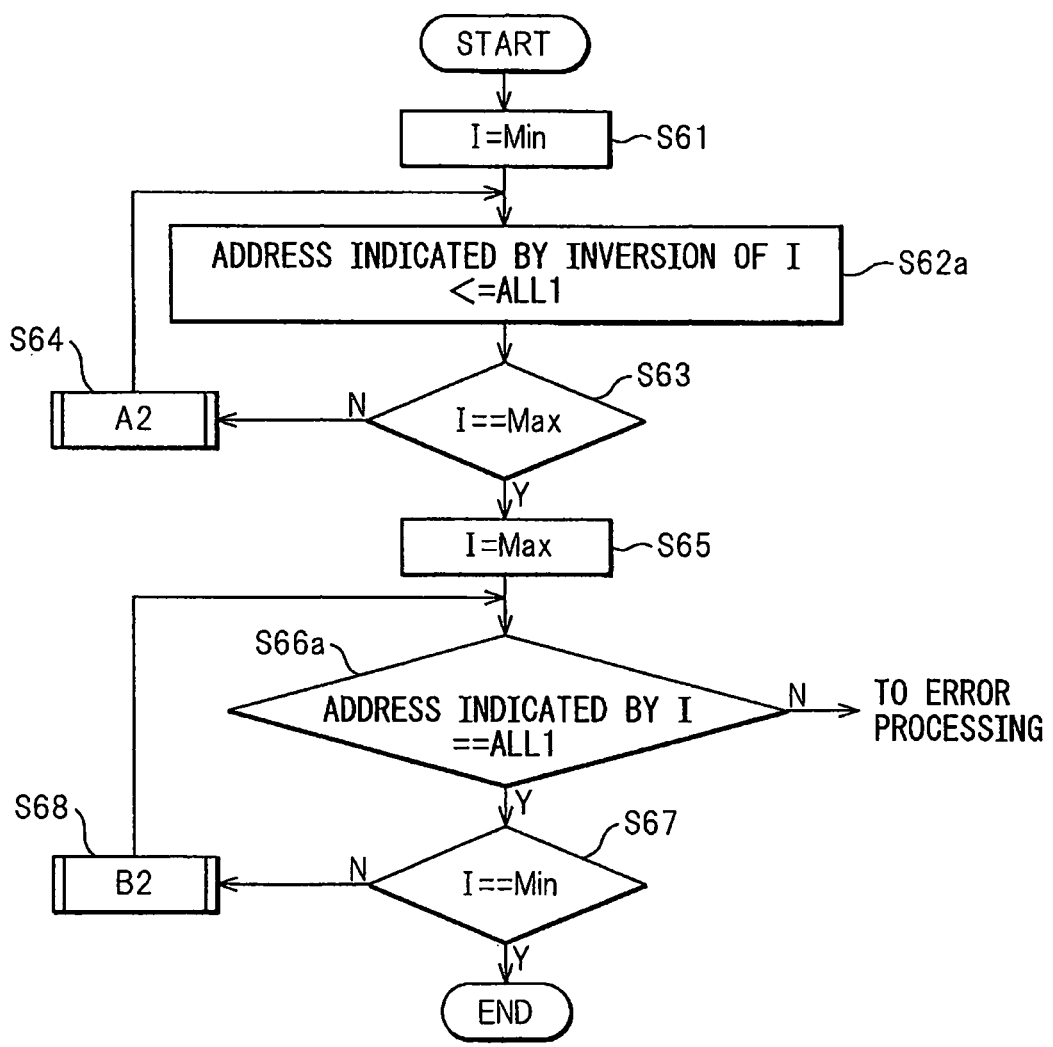
FIG. 10 is a diagram illustrating an operation flow of one embodiment in which address count-up is combined with address count-down.

FIG. 10 is a diagram showing one example of a test flow in which the test is performed by causing the counter to count up and down, as in the case of FIG. 9. In FIG. 10 also, the address counts up when writing and counts down when reading. Here also, when specifying the address, the process A2 is used in the write cycle, and the process B2 in the read cycle.

However, while, in FIG. 9, the write address and the read address have been made to match each other by inverting the address when reading, in FIG. 10 the write address and the read address are made to match each other by inverting the address when writing, not when reading.

Step S62a in FIG. 10 corresponds to the step S62 in FIG. 9. In step S62a, the address specified in the process A2 is inverted, and data of all 1s is written to the thus inverted address.

Step S66a in the read cycle corresponds to the step S66 in FIG. 9, and the data is read out of the address specified in the process B2.

As can be seen from examples 4 and 5, the address specified in the process A2 and the address specified in the process B2 are in an inverted relationship to each other. Accordingly, the data written to the address created by inverting the address specified in the process A2 can be read out by using the address specified in the process B2.

In FIG. 10 also, not only can the address lines and the address generating circuit be tested, but the counter up/down operations in the address generating circuit can also be tested. Here also, the process B2 may be performed in step S64 and the process A2 in step 68, and the address may be made to count down when writing and count up when reading.

The above embodiments have been described as being applied for testing the address lines and the counter without actually connecting the memory, but it will be appreciated that since data readout is performed on the addresses to which the data has been written, the invention can also be applied when performing the test by connecting the memory.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. A memory test method for testing a memory by generating addresses and by writing and reading test data to and from the memory according to the addresses, the method comprising:
   sequentially generating 2n n-bit addresses (where n is a positive integer) different from each other, including,
      a first address of the 2n n-bit addresses having n-bits all set to one of two values, 0 or 1,
      a second address of the 2n n-bit addresses having a first bit set to the other one of the two values and a second bit to n-th bit all set to the one of the two values,
      a (2n−1)th address of the 2n n-bit addresses having a first bit to a (n−1)th bit all set to the one of two values and a n-th bit set to the other one of the two values,
      a 2n-th address of the 2n n-bit addresses having n-bits all set to the other one of two values,
      a third to (2n−2)th addresses of the 2n n-bit addresses configured to alternate two types of addresses, the one type of address having first to k-th bits (1<k<n) all set to the one of the two values and (k+1)th to n-th bits all set to the other one of the two values, and the other type of address having bits all set to the one of the two values except for the k-th bit and the k-th bit set to the other ones of the two values;
   writing test data to each of the generated 2n n-bit addresses in the memory;
   reading test data from each of the 2n n-bit addresses in the memory after the writing;
   comparing the written test data with the read test data; and
   determining that the memory is faulty, if the written test data and the read test data do not match each other as a result of the comparison.

2. A memory test method for testing a memory by generating addresses and by writing and reading test data to and from the memory according to the addresses, the method comprising:
   sequentially generating a number of n-bit addresses (where n is a positive integer), whose first to k-th bits (1≦k≦n) are all set to one of two values, 0 or 1, and whose (k+1)th to n-th bits are all set to the other one of the two values, for all k's which range from 1 to n;
   writing first test data to each of the generated addresses in the memory;
   reading second test data from each of the addresses in the memory;
   comparing the first test data with the second test data; and
   determining that the memory is faulty, if the first test data and the second test data do not match each other as a result of the comparison,
   wherein the generating further comprises generating addresses whose k-th bit is set to one of the values, 0 or 1, and whose first to (k−1)th bits and (k+1)th to n-th bits are all set to the other one of the two values, for all k's which range from 1 to n, and
   wherein the reading comprises reading the second test data according to inverted addresses obtained by inverting the addresses generated for all k's which range from n to 1.

3. The memory test method as claimed in claim 2, wherein the address generation comprises:
   generating a first address by setting all bits of the address to 0;
   generating a second address by setting the least significant bit of the first address to 1; and
   generating an (m+1)th address by shifting all of the 1; bits in an m-th address (3≦m≦n) by one bit to the left while setting the least significant bit thereof to 1.

4. The memory test method as claimed in claim 2, wherein the address generation comprises:
   generating a first address by setting all bits of the address to 0;
   generating a second address by setting the least significant bit of the first address to 1;
   generating a third address by adding 1 to the second address;
   generating a fourth address by setting the least significant bit of the third address to 1; and
   generating a (2p+1)th address by adding 1 to a 2p-th address (2≦p≦n−1) and generating a 2(p+1)th address by setting to 1 every lower order bit than the bit that has been changed to 1 in the (2p+1)th address, the generation of the (2p+1)th and 2(p+1)th addresses being repeated for all p's which range from 2 to (n−1), thereby generating fifth to 2n-th addresses sequentially.

5. A memory test method as claimed in claim 2, wherein the address generation comprises:
   generating a first write address by setting all bits of the address to 0;
   generating a second write address by setting the least significant bit of the first write address to 1;
   generating a third write address by adding 1 to the second write address;
   generating a fourth write address by setting the least significant bit of the third write address to 1; and
   generating a (2p+1)th write address by adding 1 to a 2p-th write address (2≦p≦n−1) and generating a 2(p+1)th write address by setting to 1 every lower order bit than the bit that has been changed to 1 in the (2p+1)th write address, the generation of the (2p+1)th and 2(p+1)th write addresses being repeated for all p's which range from 2 to (n−1), thereby generating fifth to 2n-th write addresses sequentially, and
   the second test data readout comprises:
      generating a first read address by setting all bits of the address to 1;
      generating a second read address by setting the least significant bit of the first read address to 0;
      generating a third read address by subtracting 0 from the second write address;
      generating a fourth read address by setting the least significant bit of the third write address to 0;
      generating a (2p+1)th read address by subtracting 1 from a 2p-th read address (2≦p≦n−1) and generating a 2(p+1)th read address by setting to 0 every lower order bit than the bit that has been changed to 0 in the (2p+1)th read address, the generation of the (2p+1)th and 2(p+1)th read addresses being repeated for all p's which range from 2 to (n−1), thereby generating fifth to 2n-th read addresses sequentially; and
      sequentially reading out the second test data by using the 2n inverted addresses created by inverting the addresses generated in the steps of generating the first to 2n-th read addresses.

6. A memory test method for testing a memory by generating addresses and by writing and reading test data to and from the memory according to the addresses, the method comprising:
   sequentially generating a number of n-bit addresses (where n is a positive integer), whose first to k-th bits (1≦k≦n) are all set to one of two values, 0 or 1, and whose (k+1)th to n-th bits are all set to the other one of the two values, for all k's which range from 1 to n;

writing first test data to each of the generated addresses in the memory;

reading second test data from each of the addresses in the memory;

comparing the first test data with the second test data; and determining that the memory is faulty, if the first test data and the second test data do not match each other as a result of the comparison, wherein the generating operation comprises generating addresses whose k-th bit is set to one of the values, 0 or 1, and whose first to (k−1)th bits and (k+1)th to n-th bits are all set to the other one of the two values, for all k's which range from 1 to n, and inverting the generated addresses, wherein the writing operation comprises writing the first test data for each of the inverted addresses, and wherein the reading operation comprises reading the second test data according to the addresses generated for all k's which range from n to 1.

7. A memory test device for testing a memory by generating addresses and by writing and reading test data to and from the memory by using the address, the device comprising:

an address generator for sequentially generating a number of n-bit addresses (where n is a positive integer), whose first to k-th bits ($1 \leq k \leq n$) are all set to one of two values, 0 or 1, and whose (k+1)th to n-th bits are all set to the other one of the two values, for all k's which range from 1 to n;

a test data generator for generating first test data, and for writing the generated test data to each of the generated addresses in the memory;

a data comparator for reading second test data from each of the addresses in the memory, and for comparing the first test data with the second test data; and a test evaluator for determining that the memory is faulty, if the first test data and the second test data do not match each other as a result of the comparison, wherein the address generator further generates addresses whose k-th bit is set to one of the values, 0 or 1, and whose first to (k−1)th bits and (k+1)th to n-th bits are all set to the other one of the two values, and wherein the data comparator sequentially reads out the second test data by using a number of inverted addresses obtained, for all k's which range from 1 to n by inverting the addresses generated by the address generator.

\* \* \* \* \*

UNITED STATES PATENT AND TRADEMARK OFFICE
CERTIFICATE OF CORRECTION

| | |
|---|---|
| PATENT NO. | : 8,503,259 B2 |
| APPLICATION NO. | : 12/382485 |
| DATED | : August 6, 2013 |
| INVENTOR(S) | : Shogo Shibazaki et al. |

Page 1 of 1

It is certified that error appears in the above-identified patent and that said Letters Patent is hereby corrected as shown below:

In the Claims:

In Col. 12, Line 1, In Claim 3, delete "1," and insert -- 1 --, therefor.

Signed and Sealed this
Fifth Day of November, 2013

Teresa Stanek Rea
*Deputy Director of the United States Patent and Trademark Office*